(12) United States Patent
Qin et al.

(10) Patent No.: US 11,114,328 B2
(45) Date of Patent: Sep. 7, 2021

(54) DEVICES, SYSTEMS AND METHODS FOR ELECTROSTATIC FORCE ENHANCED SEMICONDUCTOR BONDING

(71) Applicant: Micron Technology, Inc., Boise, ID (US)

(72) Inventors: Shu Qin, Boise, ID (US); Ming Zhang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/206,895

(22) Filed: Nov. 30, 2018

(65) Prior Publication Data

US 2019/0096732 A1 Mar. 28, 2019

Related U.S. Application Data

(63) Continuation of application No. 14/173,489, filed on Feb. 5, 2014, now Pat. No. 10,153,190.

(51) Int. Cl.
*H01L 21/683* (2006.01)
*H01L 21/762* (2006.01)

(52) U.S. Cl.
CPC .... *H01L 21/6833* (2013.01); *H01L 21/76251* (2013.01)

(58) Field of Classification Search
CPC ............... H01L 21/6833; H01L 21/76251
See application file for complete search history.

(56) References Cited

U.S. PATENT DOCUMENTS

| 3,506,424 | A | | 4/1970 | Pomerantz |
| 4,897,171 | A | | 1/1990 | Ohmi |
| 5,102,821 | A | * | 4/1992 | Moslehi ............... H01L 21/2007 148/DIG. 12 |
| 5,886,866 | A | | 3/1999 | Hausmann |
| 6,887,342 | B2 | | 5/2005 | Stewart et al. |
| 2001/0046112 | A1 | | 11/2001 | Herchen et al. |

(Continued)

FOREIGN PATENT DOCUMENTS

| JP | 49-751 S | 1/1974 |
| JP | 04290215 A | 10/1992 |
| JP | 06252369 A | 9/1994 |
| JP | 09007910 A | 1/1997 |
| WO | 2011001978 A1 | 1/2011 |
| WO | 2011150311 A1 | 12/2011 |

OTHER PUBLICATIONS

CN Patent Application No. 201580012016.7—Chinese Office Action and Search Report, dated Aug. 20, 2018, with English Translation, 21 pages.

(Continued)

*Primary Examiner* — Daniel McNally
(74) *Attorney, Agent, or Firm* — Perkins Coie LLP

(57) ABSTRACT

Various embodiments of microelectronic devices and methods of manufacturing are described herein. In one embodiment, a method for enhancing wafer bonding includes positioning a substrate assembly on a unipolar electrostatic chuck in direct contact with an electrode, electrically coupling a conductor to a second substrate positioned on top of the first substrate, and applying a voltage to the electrode, thereby creating a potential differential between the first substrate and the second substrate that generates an electrostatic force between the first and second substrates.

8 Claims, 4 Drawing Sheets

(56) References Cited

U.S. PATENT DOCUMENTS

| | | |
|---|---|---|
| 2004/0020602 A1* | 2/2004 | Stewart ................ H01L 21/187 |
| | | 156/379.7 |
| 2005/0031796 A1 | 2/2005 | Wu et al. |
| 2007/0131350 A1 | 6/2007 | Ricci et al. |
| 2011/0011514 A1 | 1/2011 | Hashizume et al. |
| 2011/0083786 A1* | 4/2011 | Guo .................... B32B 37/0007 |
| | | 156/64 |
| 2012/0120545 A1 | 5/2012 | Fujisawa et al. |
| 2015/0221540 A1 | 8/2015 | Qin et al. |

OTHER PUBLICATIONS

CN Patent Application No. 201580012016.7—Chinese Office Action and Search Report, dated Jan. 31, 2018, with English Translation, 16 pages.

EP Patent Application No. 15746036.1—Extended European Search Report, dated Aug. 8, 2017, 10 pages.

International Search Report and Written Opinion dated Apr. 29, 2015 in International Patent Application No. PCT/US2015/012833, 14 pages.

JP Patent Application No. 2016-549546—Japanese Office Action and Search Report, dated Jun. 5, 2018, with English Translation, 9 pages.

JP Patent Application No. 2016-549546—Japanese Office Action and Search Report, dated Sep. 5, 2017, with English Translation, 4 pages.

KR Patent Application No. 10-2016-7024375—Korean Office Action and Search Report, dated Nov. 28, 2017, with English Translation, 17 pages.

KR Patent Application No. 10-2016-7024375—Korean Office Action, dated May 29, 2018, with English Translation, 18 pages.

"Office Action dated Feb. 24, 2016 in Taiwan Application No. 104103944, 17 pages."

KR Patent Application No. 10-2016-7024375—Korean Office Action, dated Dec. 20, 2018, with English Translation, 8 pages.

* cited by examiner

DEVICES, SYSTEMS AND METHODS FOR ELECTROSTATIC FORCE ENHANCED SEMICONDUCTOR BONDING

CROSS-REFERENCE TO RELATED APPLICATIONS

This application is a continuation of U.S. application Ser. No. 14/173,489, filed Feb. 5, 2014, now U.S. Pat. No. 10,153,190, which is incorporated herein by reference in its entirety.

TECHNICAL FIELD

The present technology is related to semiconductor devices, systems and methods. In particular, some embodiments of the present technology are related to devices, systems and methods for enhanced bonding between semiconductor materials.

BACKGROUND

In semiconductor manufacturing, several processes exist for adding a layer of material to a semiconductor substrate, including transferring a layer of material from one semiconductor substrate to another. Such processes include methods for forming silicon-on-insulator ("SOI") wafers, semiconductor-metal-on-insulator ("SMOI") wafers, and silicon-on-polycrystalline-aluminum-nitride ("SOPAN") wafers. For example, FIGS. 1A-1D are partially schematic cross-sectional views illustrating a semiconductor assembly in a prior art method for transferring a silicon material from one substrate to another. FIG. 1A illustrates a first substrate 100 including a base material 104 and an oxide material 102 on the base material 104. As shown in FIG. 1B, a second substrate 120 is then positioned on the first substrate 100 for bonding (as indicated by arrow A). The second substrate 120 also includes a silicon material 124 and an oxide material 122 on the silicon material 124. The second substrate 120 is positioned on the first substrate 100 such that the first substrate oxide material 102 contacts the second substrate oxide material 122 and forms an oxide-oxide bond. The silicon material 124 has a first portion 124a and a second portion 124b delineated by an exfoliation material 130 at a selected distance below a downwardly facing surface of the first portion 124a. The exfoliation material 130 can be, for example, an implanted region of hydrogen, boron, and/or other exfoliation agents.

FIG. 1C illustrates the semiconductor assembly formed by bonding the first substrate 100 to the second substrate 120. Once the substrates 100, 120 are bonded, the first portion 124a of the semiconductor material 124 is removed from the second portion 124b by heating the assembly such that the exfoliation material 130 cleaves the silicon material 124. The second portion 124b remains attached to the first substrate 100, as shown in FIG. 1D, and has a desired thickness for forming semiconductor components in and/or on the second portion 124b. The first portion 124a of the silicon material 124 can be recycled to supply additional thicknesses of silicon material to other first substrates.

One challenge of transferring silicon materials from one substrate to another is that poor bonding between the first and second substrates can greatly affect the yield and cost of the process. In transfer processes, "bonding" generally includes adhering two mirror-polished semiconductor substrates to each other without the application of any macroscopic adhesive layer or external force. During and/or after the layer transfer process, poor bonding can cause voids, islands or other defects between the two bonded substrate surfaces. For example, the material properties of certain materials can result in poor bonding, such as silicon with a metal of SMOI or a poly-aluminum nitride surface with silicon of SOPAN.

Conventional bonding processes also include applying an external mechanical force (e.g., a weight or a compressive force) to the first and second substrates for a period of time. In addition to adding time, adding cost, and reducing throughput, bonding processes that use an external force suffer from several drawbacks. First, the downward force applied on the second substrate is not distributed uniformly and can cause defects in the substrate or even break one or both substrates. Second, because the force is not distributed uniformly, the magnitude of the applied mechanical force is limited to the maximum allowed force in the area with the highest force concentration, which means that other areas of the substrate do not experience the maximum force. Third, the use of an external mechanical force can contaminate the semiconductor assembly. Last, some semiconductor devices can have large depressions in the under-layer topography because of dishing from prior chemical-mechanical planarization processing making it difficult to bond the oxide layers to each other.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Several embodiments of the present technology are described below with reference to processes for enhanced substrate-to-substrate bonding. Many details of certain embodiments are described below with reference to semiconductor devices and substrates. The term "semiconductor device," "semiconductor substrate," or "substrate" is used throughout to include a variety of articles of manufacture, including, for example, semiconductor wafers or substrates of other materials that have a form factor suitable for semiconductor manufacturing processes. Several of the processes described below may be used to improve bonding on and/or between substrates.

Figure 1A:
FIGS. 1A-1D are schematic cross-sectional views of various stages in a method for transferring and bonding a semiconductor layer according to the prior art.
Figure 1B:
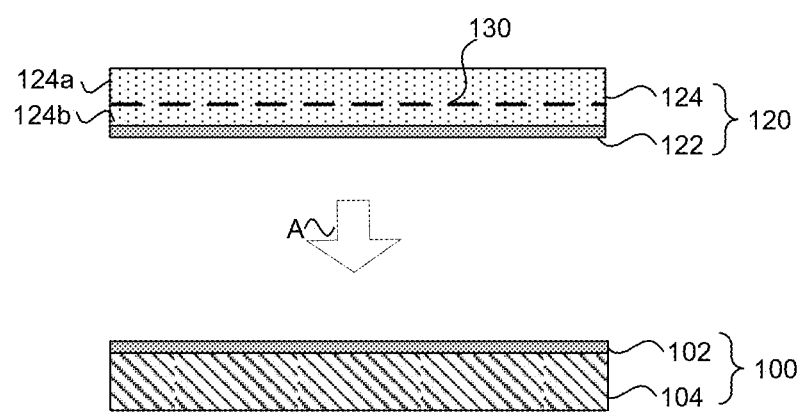
Figure 1C:
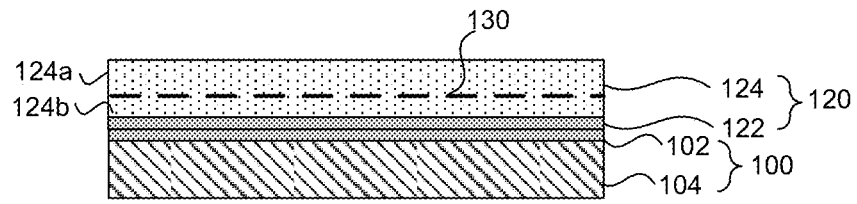
Figure 1D:
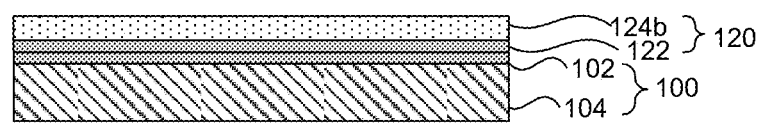
Figure 2A:
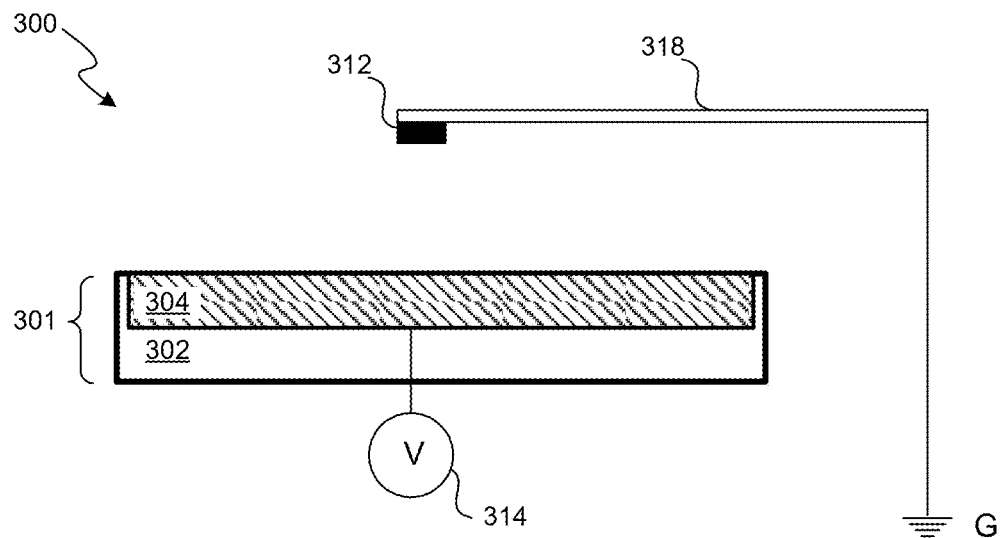
FIG. 2A is a schematic cross-sectional view of a bonding system configured in accordance with the present technology.
Figure 2B:
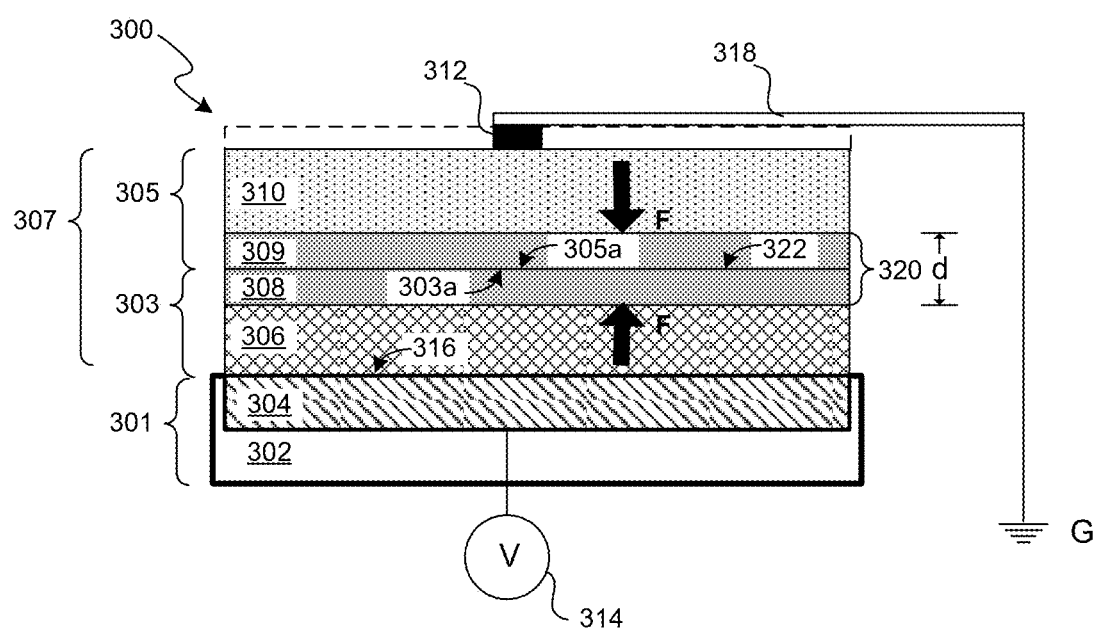
FIG. 2B is a schematic cross-sectional view of the bonding system in FIG. 2A supporting a semiconductor assembly.
Figure 3:
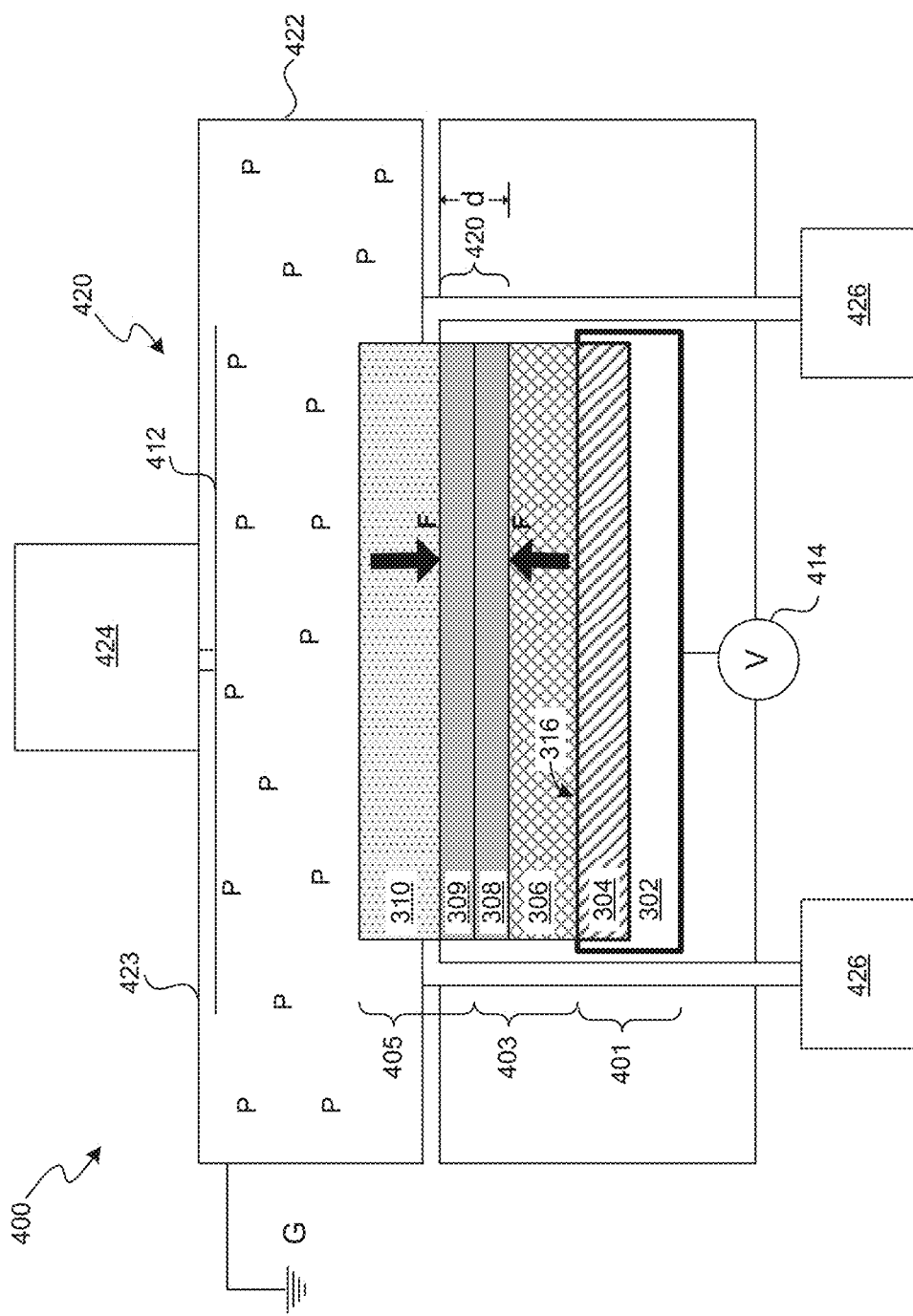
FIG. 3 is a schematic cross-sectional view of a bonding system configured in accordance with another embodiment of the present technology.

FIGS. 2A-3 are partially schematic cross-sectional views of enhanced bonding systems and methods in accordance with embodiments of the technology. In the following description, common acts and structures are identified by the same reference numbers. Although the processing operations and associated structures illustrated in FIGS. 2A-3 are directed to SOI-based transfers, in certain embodiments the process can be used to enhance bonding in other materialbased transfer layer methods, such as SMOI-based transfers, SOPAN-based transfers, and the like.

FIG. 2A is a cross-sectional side view of one embodiment of an isolated bonding system 300 ("system 300"), and FIG. 2B is a cross-sectional side view of the system 300 supporting a substrate assembly 307. As shown in FIG. 2B, the substrate assembly 307 includes a first substrate 303 (e.g., a handling substrate) and a second substrate 305 (e.g., a donor substrate) on the handling substrate 303. The first substrate 303 can have a base material 306 and first oxide layer 308, and the second substrate 305 can include a semiconductor material 310 and a second oxide layer 309. The base material 306 can be an insulator, polysilicon aluminum nitride, a semiconductor material (e.g., silicon (1,0,0), silicon carbide, etc.), a metal, or another suitable material. The semiconductor material 310 can include, for example, a silicon wafer made from silicon (1,1,1) or other semiconductor materials that are particularly well suited for epitaxial formation of semiconductor components or other types of components. In other embodiments, only one of the first or second substrates 303, 305 may include an oxide layer. Additionally, the orientation of the first and second substrates 303 and 305 can be inverted relative to the orientation shown in FIG. 2B.

As shown in FIG. 2B, the second substrate 305 can be positioned on the first substrate 303 such that the second oxide layer 309 of the second substrate 305 contacts the first oxide layer 308 of the first substrate 303. As such, the shared contact surfaces of the first and second oxide layers 308, 309 form a bonding interface 322 between the first and second substrates 303, 305. Additionally, the first and second oxide layers 308, 309 form a dielectric barrier 320 between the first and second substrates 303, 305. The dielectric barrier 320 can have a thickness d that is between about 1 nm and about 20 μm. In a particular embodiment, the dielectric barrier 320 can have a thickness d that is between about 1 μm and about 10 μm.

Referring to FIGS. 2A and 2B together, the system 300 can include a unipolar electrostatic chuck (ESC) 301 having an electrode 304, a conductor 312, and a power supply 314. In some embodiments, the ESC 301 includes a dielectric base 302 that carries the electrode 304. The electrode 304 can include a support surface 316 configured to receive the first substrate 303 and/or the substrate assembly 307. The power supply 314 is coupled to the electrode 304 and configured to supply a voltage to the electrode 304, and the conductor 312 is electrically coupled to a ground source G. The substrate assembly 307 can be positioned on the support surface 316 of the electrode 304, and the conductor 312 can contact a portion of the substrate assembly 307 opposite the dielectric barrier 320. In the embodiment shown in FIG. 2B the first substrate 303 contacts the electrode 304 and the second substrate 305 contacts the conductor 312.

The conductor 312 can be a single contact pin or pad connected to the ground source G via a connector 318. The conductor 312 can be configured to engage all or a portion of the surface of the substrate assembly 307 facing away from the ESC 301. For example, as shown in FIG. 2B, the conductor 312 can be a pad that covers only a portion of the surface of the second substrate 305, and the conductor 312 can be positioned at the center of the second substrate 305. In other embodiments, the conductor 312 can contact any other portion of the second substrate 305 and/or the conductor 312 can have the same size as the second substrate (shown in dashed lines). Although the conductor 312 includes only a single contact pad in the embodiment shown in FIG. 2B, in other embodiments the conductor 312 can have multiple pins, pads or other conductive features configured in a pattern to provide the desired current distribution across the second substrate 305. In other embodiments, the conductor 312 can have any size, shape and/or configuration, such as concentric rings, an array of polygonal pads, etc.

Unlike conventional ESCs, the ESC 301 of the present technology does not have a dielectric layer separating the electrode 304 from the first substrate 303 and/or substrate assembly 307. In other words, when the first substrate 303 is on the support surface 316, the first substrate 303 directly contacts the electrode 304 without a dielectric material attached to the support surface 316 of the electrode 304. Although in some cases a bottom surface of the first substrate 303 may include a native oxide film, the film is very thin (e.g., 10-20 Å) and thus provides negligible electrical resistance between the electrode 304 and the first substrate 303. As a result, voltages applied to the electrode 304 pass directly to the first substrate 303. Because the first substrate 303 directly contacts the electrode 304 and has negligible internal resistance, a conventional bi-polar or multi-polar ESC cannot be used with the system 300 as the first substrate would provide a direct electrical connection between the electrodes and short the system.

In operation, the first substrate 303 is positioned on the support surface 316 in direct electrical contact with the electrode 304. If the second substrate 305 is not already positioned on the first substrate 303, the second substrate 305 can be manually or robotically placed on the first substrate 303. For example, as shown in FIG. 2B, the connector 318 can be in the form of a conductive robotic arm that can support the second substrate 305 and move the second substrate 305 over the first substrate 303. The robotic arm can include a negative pressure source (not shown) at one end that engages and holds the second substrate 305 until a desired position is achieved.

Once the second substrate 305 is in position for bonding with the first substrate 303, the conductor 312 can be placed in contact with the second substrate 305. The power supply 314 is then activated to apply a voltage to the electrode 304. As previously discussed, the first substrate 303 operates as a continuation of the electrode 304 because the first substrate 303 directly contacts the electrode 304 without a dielectric material between the two. As a result, an electrical charge accumulates at or near a top surface 303a of the first substrate 303 thereby causing an opposite electrical charge to accumulate at or near a bottom surface 305a of the second substrate 305. Accordingly, an electric potential is established across the dielectric barrier 320 between the first and second substrates 303, 305. The electric potential creates an electrostatic force F that pulls the second substrate 305 towards the first substrate 303 and enhances the bond between the first and second substrates 303, 305.

The electrostatic force F generated by the system 300 is significantly greater than that of conventional systems because it improves the electrical contact with the first substrate and decreases the dielectric distance between the first and second substrates 303, 305. The magnitude of the electrostatic force F can be determined by the following equation (1):

$$F = \frac{1}{2}\varepsilon_0 \left(\frac{kV}{d}\right)^2, \tag{1}$$

where
k is a dielectric constant;
d is the dielectric thickness; and
V is the applied voltage.

As indicated by the equation (1), the smaller the dielectric thickness d and/or the greater the applied voltage V, the greater the electrostatic force F. As such, the magnitude of the electrostatic force F can be controlled by adjusting the applied voltage V and/or the dielectric thickness d. In some embodiments, the system 300 can include a controller (not shown) that automatically controls the magnitude, duration, and/or timing of the electrostatic force F by adjusting the applied voltage V.

The system 300 and associated methods are expected to provide several advantages over conventional methods for enhanced substrate bonding that apply an external mechanical force. First, the magnitude of the electrostatic force F achieved by the system 300 is considerably greater than the compressive force imposed by conventional mechanical force applications. By way of example, on a 6-inch wafer, mechanical force-generating devices can apply a maximum force of 100 kN, while the current system can generate an electrostatic force F of greater than 200 kN. Also, in contrast to conventional methods and systems, the system 300 can evenly distribute the electrostatic force F across the substrates 303, 305. As evidenced by equation (1) above, the magnitude of the electrostatic force F is only dependent on two variables: the applied voltage V and the dielectric thickness d. Both the applied voltage V and the dielectric thickness d are intrinsically constant across the cross-sectional area of the substrates 303, 305. Additionally, in conventional methods utilizing a mechanical compressive force, the handling substrate and/or substrate assembly would have to be moved from one machine to the next and/or a force-generating machine would have to be moved into the vicinity of the handling substrate and/or substrate assembly. The current system, however, does not require any moving of machine or substrates and can achieve enhanced bonding by adjusting the applied voltage. As such, the system 300 of the present technology can be operated at a lower cost and higher throughput.

FIG. 3 is a cross-sectional side view of another embodiment of a bonding system 400 ("system 400") configured in accordance with the present technology. The first substrate 403, second substrate 405 and ESC 401 can be generally similar to the first substrate 303, second substrate 305 and ESC 301 described in FIGS. 2A and 2B, and like reference numerals refer to the components. However, instead of having a conductor in the form of a conductive pin or pad as shown in FIG. 3, the system 400 includes a plasma source 424, a plasma chamber 422 filled with a plasma gas P that defines a conductor 423 electrically coupled to the plasma gas P. The plasma gas P is electrically conductive such that the plasma gas P is also a conductor. The conductor 423, for example, can be electrically connected to a ground source G via an electrical element 412 (e.g., an antenna, an electrode, etc.). As shown in FIG. 3, the plasma chamber 422 extends around at least a portion of the second substrate 405. As such, the first substrate 403 and/or the electrode 404 is electrically isolated from the plasma chamber 422.

The plasma gas P can be a noble, easily ionized plasma gas, such as Argon (Ar), Helium (He), Nitrogen ($N_2$), and others. The plasma source 424 can be an inductively coupled-plasma ("ICP") source, microwave, radiofrequency ("RF") source and/or other suitable sources. A plasma gas in bulk acts as a virtual conductor. As the plasma gas P is released into the plasma chamber 422, the plasma gas P charges the second substrate 405. Activation of the power supply 414 creates a potential difference across the dielectric barrier 420, thereby generating an electrostatic force F between the substrates 403, 405.

In some embodiments, the system 400 can also include a vacuum source 426 connected to the plasma chamber 422 that draws the plasma gas downwardly. The system 400 can also include additional features typically associated with vacuum chamber systems, such as power conditioners (e.g., rectifiers, filters, etc.), pressure sensors, and/or other suitable mechanical/electrical components.

The system 400 provides several advantages over conventional systems, including those advantages discussed above with reference to the system 300. Additionally, the system 400 can reduce contamination as the enhanced bonding is carried out in a pressurized, sealed plasma chamber 422.

Any of the above-described systems and methods can include additional features to expedite substrate processing. For example, any of the above systems can include one or more features to automate the bonding and/or layer transfer process, such as lift pins and/or robotic transfer arms for loading and unloading the substrates from the system.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A system for enhancing bonding between a first substrate and a second substrate, the first substrate having a central portion and a perimeter portion, the system comprising:

a unipolar electrostatic chuck configured to receive the first substrate, the chuck including a dielectric base and an electrode at least partially within the dielectric base, wherein a top surface of the electrode is configured to directly electrically contact the central portion and the perimeter portion of the first substrate;

a conductor configured to be electrically coupled to the second substrate; and a power supply electrically coupled to the electrode and conductor, respectively, to apply an electrical bias between the electrode and conductor.

2. The system of claim 1, further comprising an electrical element positioned in a plasma chamber configured to energize a plasma gas in the plasma chamber.

3. The system of claim 2 wherein the plasma chamber is configured to contact at least a portion of the second substrate and is electrically isolated from the first substrate.

4. The system of claim 2, further comprising a vacuum source coupled to the plasma chamber.

5. The system of claim 1 wherein the conductor includes a contact pad.

6. The system of claim 5 wherein the contact pad is configured to contact at least a portion of a top surface of the second substrate.

7. The system of claim 1 wherein the unipolar electrostatic chuck does not include a dielectric layer between the electrode and the first substrate.

8. The system of claim 1 wherein the central portion and the perimeter portion of the first substrate make up an entirety of the first substrate, and wherein the electrode of the unipolar electrostatic chuck is configured to directly contact the entirety of the first substrate.

\* \* \* \* \*